(12) United States Patent
Kitagawa et al.

(10) Patent No.: US 7,167,030 B2
(45) Date of Patent: Jan. 23, 2007

(54) DRIVE CIRCUIT AND METHOD OF APPLYING HIGH VOLTAGE TEST THEREON

(75) Inventors: Masahiro Kitagawa, Nukata-gun (JP); Akio Kojima, Anjo (JP); Junichi Nagata, Nukata-gun (JP)

(73) Assignee: Denso Corporation, Kariya (JP)

( * ) Notice: Subject to any disclaimer, the term of this patent is extended or adjusted under 35 U.S.C. 154(b) by 136 days.

(21) Appl. No.: 11/063,853

(22) Filed: Feb. 24, 2005

(65) Prior Publication Data

US 2005/0212568 A1    Sep. 29, 2005

(30) Foreign Application Priority Data

Mar. 25, 2004   (JP)   .............................. 2004-089197

(51) Int. Cl.
*H03K 3/00*      (2006.01)
(52) U.S. Cl. ...................................... 327/108; 324/527
(58) Field of Classification Search ................ 327/108; 324/527, 537
See application file for complete search history.

(56) References Cited

U.S. PATENT DOCUMENTS 5,796,287 A * 8/1998 Furutani et al. ............ 327/374
6,392,463 B1   5/2002 Kitagawa et al. ........... 327/309

* cited by examiner

*Primary Examiner*—Kenneth B. Wells
(74) *Attorney, Agent, or Firm*—Posz Law Group, PLC (57) ABSTRACT

A drive circuit that supplies electric power to an electric load from a DC electric source includes a pair of series-connected first and second MOSFETS of the same conduction type, a pair of clamp circuits respectively connected between the drains and gates of the first and second MOSFETS, a series circuit of a first resistor and a switch, a first test terminal; a second test terminal connected to a joint of the first and second MOSFETS, a third test terminal for operating the switch, a fourth test terminal connected a joint of the first resistor and the switch; and a second resistor connected between the gate of the second MOSFET and the first test terminal. The switch and the first resistor are connected between the gate and the source of the first MOSFET to close when the drive circuit is normally operated and to open when it is given a high voltage test.

8 Claims, 10 Drawing Sheets

DRIVE CIRCUIT AND METHOD OF APPLYING HIGH VOLTAGE TEST THEREON

CROSS REFERENCE TO RELATED APPLICATION

The present application is based on and claims priority from Japanese Patent Application 2004-89197, filed Mar. 25, 2004, the contents of which are incorporated herein by reference.

BACKGROUND OF THE INVENTION

1. Field of the Invention

The present invention relates to a drive circuit that is connected between an electric power source and an electric load and a method of applying a high voltage test on the drive circuit.

2. Description of the Related Art

JP-A-2001-160748 or U.S. Pat. No. 6,392,463 B1, which is a counterpart of the former, discloses a drive circuit that includes series connected MOSFET type transistors (hereinafter referred to as MOSFET or MOSFETS) for high-side or low-side driving. The drive circuit includes a clamp circuit that protects the MOSFETS when a high voltage is applied to the drive circuit. Such a clamp circuit is a series circuit of a backflow preventing diode and a zener diode that is connected between the drain and the gate of an N-channel MOSFET for low-side driving.

In order to provide a drive circuit with a fail safe function, the same MOSFETS may be connected in series for high-side driving or low-side driving. In this case, the drive circuit can properly drive an electric load connected to the drive circuit even if one of the transistors short-circuits. However, if the clamp circuit that is disclosed in the above publication is merely connected to this drive circuit, both the MOSFETS may simultaneously turn on when a high voltage is applied to the drain terminal of the MOSFETS even if the gate signal is not applied to the gate terminal. In other words, it is impossible to keep the MOSFETS turning off when a high voltage is applied to the drain terminal.

SUMMARY OF THE INVENTION

In view of the above described problem, an object of the invention is to provide a drive circuit that will not simultaneously turn on when high voltage is applied thereto.

According to a feature of the invention, a drive circuit for supplying electric power to an electric load from a DC electric source includes a pair of series-connected first and second MOSFETS of the same conduction type, a pair of clamp circuits respectively connected between the drains and gates of the first and second MOSFETS, a series circuit of a first resistor and a switch connected between the gate and the source of the first MOSFET, a first test terminal, a second test terminal connected to a joint of the first and second MOSFETS, a third test terminal for operating the switch, a fourth test terminal connected to a joint of the first resistor and the switch and a second resistor connected between the gate of the second MOSFET and the first test terminal.

When the drive circuit is normally operated, the switch is closed so that the first and the second MOSFETS will not simultaneously turn on until the gate signal becomes twice as high as a voltage level for the clamp circuit to start clamping.

In the above drive circuit the first and second MOSFETS may be N-channel or P-channel MOSFETS. The switch may be a semiconductor having a control terminal connected to the third test terminal and a resistor connected between the control terminal and the source of the first MOSFET.

If the first and second MOSFETS are N-channel MOSFETS, the switch may be a PNP transistor having a base terminal connected to the third test terminal and a resistor connected between the base terminal and the source of the first MOSFET. On the other hand, the switch may be an NPN transistor having a base terminal connected to the third test terminal and a resistor connected between the base terminal and the source of the first MOSFET, if the first and second MOSFETS are P-channel MOSFETS. When the drive circuit is operated, no signal is necessary to apply to the third test terminal.

Another object of the invention is to provide an improved method of applying test voltage.

According to another feature of the invention, a method of applying a high voltage test on the drive circuit that has N-channel MOSFETS includes a step of opening the switch, a step of grounding the drain of the first MOSFET, the second test terminal and the source of the second MOSFET, and a step of applying test voltage to the first and fourth test terminals.

According to another feature of the invention, a method of applying a high voltage test on the drive circuit that has P-channel MOSFETS includes a step of opening the switch, a step of grounding the first and fourth test terminals and a step of applying test voltage to the drain of the first MOSFET, the second test terminal and the source of the second MOSFET.

With one of the above methods, it is easy to apply test voltage between the gates and the sources of the pair of MOSFETS and between the gates and the drains thereof at the same time.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Figure 1:
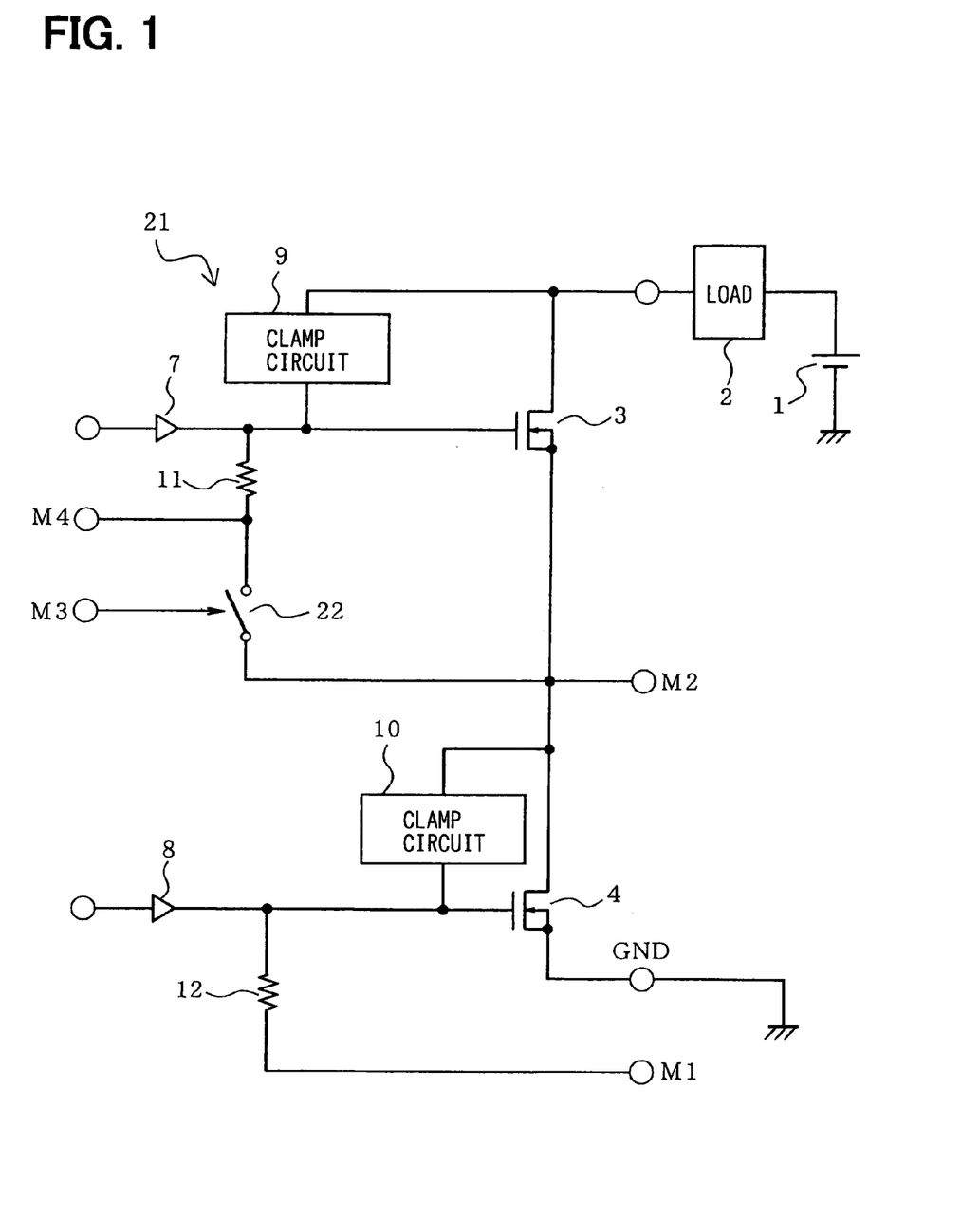
FIG. 1 is a circuit diagram illustrating a drive circuit according to the first embodiment of the invention.

A drive circuit 21 according to the first embodiment of the invention will be described with reference to FIG. 1.

The drive circuit 21 includes a pair of first N-channel MOSFETS 3 and a second N-channel MOSFETS 4 that are connected in series to each other and disposed between an electric load 2 and a ground GND, drivers 7, 8, a pair of first and second clamp circuits 9, 10, a first resistor 11, a second resistor 12, a switch 22, four test terminals M1, M2, M3, M4, etc. The MOSFETS 3, 4 respectively have gates, drains and sources. The gates are respectively connected to the drivers 7, 8 so that the same logical gate signal is applied to turn on or off current supplied to the electric load 2 from a battery 1. The drain of the first MOSFET 3 is connected to a low-side terminal of the electric load 2, and the source of the second MOSFET 4 is connected to the ground. The other terminal (high-side terminal) of the electric load 1 is connected to the positive side (high-side) terminal of the battery 1.

The first clamp circuit 9 is connected between the drain and gate of the first MOSFETS 3, and the second clamp circuit 10 is connected between the drain and gate of the second MOSFETS 4. The first resistor 11 is connected in between the gate of the first MOSFET 3 and the switch 22. The resistor 12 is connected between the gate of the second MOSFETS 4 and the test terminal M1. The test terminal M2 is connected to a joint of the first and second MOSFETS 3, 4, and the test terminal M3 is a terminal to operate the switch 22. The test terminal M4 is connected to a joint of the first resistor 11 and the switch 22 and to the test terminal M2 via the switch 22.

In the case that the electric load 2 is a DC motor, the switch 22 is closed. In operation, a high level gate signal to render the gates of the first MOSFET 3 and the second MOSFET 4 to be higher in potential than the source is applied to the gates so that the first MOSFET 3 and the second MOSFET 4 can turn on.

If a load dump surge voltage is generated at the positive terminal of the battery 1 and applied to the drain of the first MOSFET 3 due to loose connection or incomplete connection of the battery 1, the MOSFETS 3, 4 do not turn on because the clamp circuits 9, 10 are connected in series via the resistor 11 and the switch 22 between the drain of the first MOSFET 3 and the gate of the second MOSFET 4. That is, the second MOSFET 4 does not turn on because the gate signal thereof is much lower than a voltage level that is twice as high as the voltage level to start clamping of the clamp circuits 9, 10.

In the case of a screening or burning test, the switch 22 is opened. Then, a high voltage is applied to the test terminals M1 and M4 while the drain of the first MOSFET 3, the test terminal M2 and the source of the second MOSFET 4 are grounded. Therefore, it is possible to apply a high voltage to the oxidized film of the gates of the MOSFETS 3, 4.

Thus, the MOSFETS 3, 4 do not simultaneously turn on even when a high voltage is applied to MOSFETS 3, 4.

Figure 2:
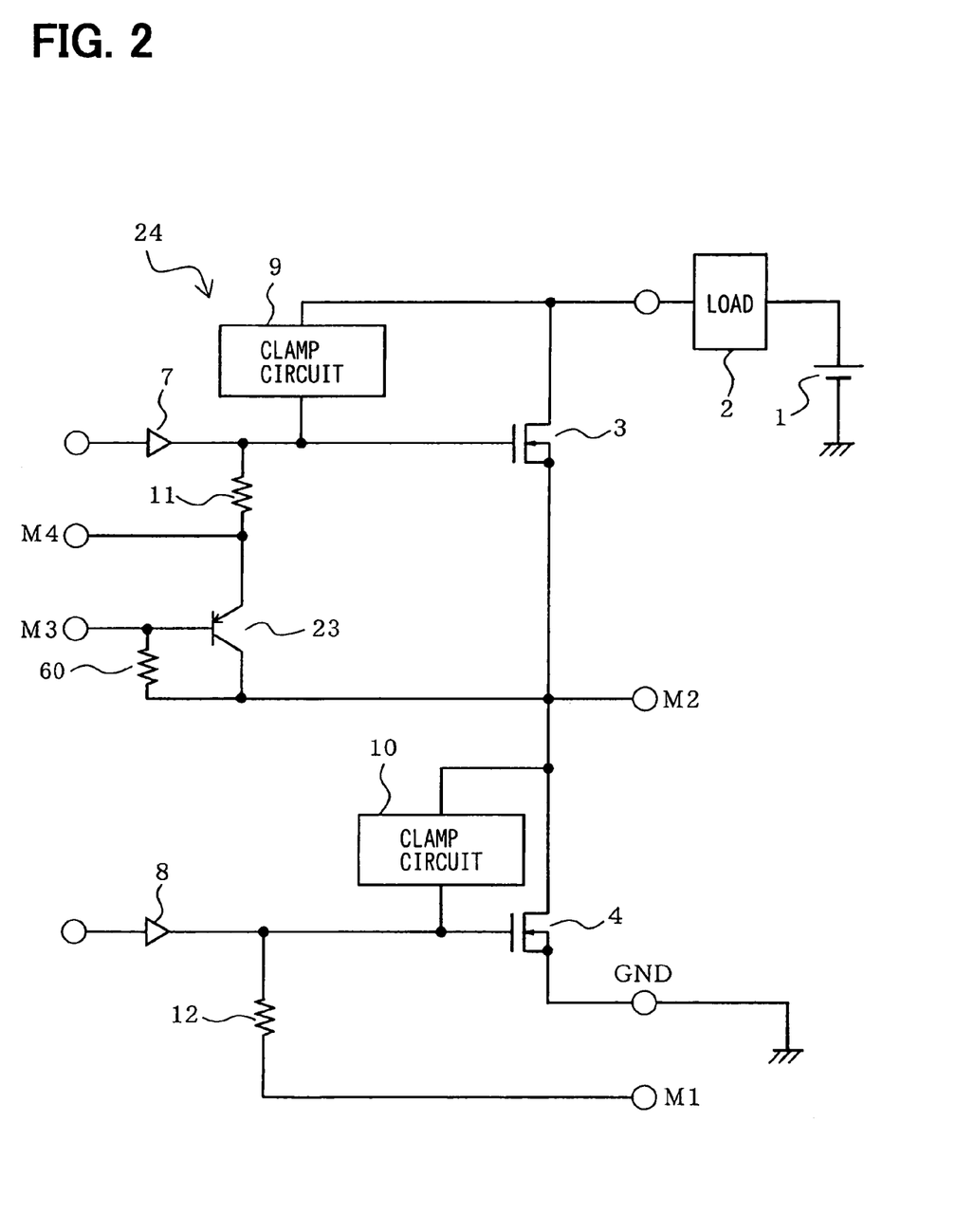
FIG. 2 is a circuit diagram illustrating a drive circuit according to the second embodiment of the invention.

A drive circuit 24 according to the second embodiment of the invention will be described with reference to FIG. 2. Incidentally, the same reference numeral indicates the same or substantially the same part, portion or component as that described in the description of the precedent embodiment of the invention.

The drive circuit 24 has a switch circuit that includes a PNP transistor 23 and a resistor 60 instead of the switch 22. The test terminal M3 is connected to the base of the transistor 23, and the resistor 60 is connected between the base and the collector of the transistor 23.

The transistor 23 is turned off by applying a high level signal on the test terminal M3 when a high voltage test is made, and turned on when the drive circuit 24 is operated without a signal on the test terminal M3 to drive the electric load 2.

Figure 3:
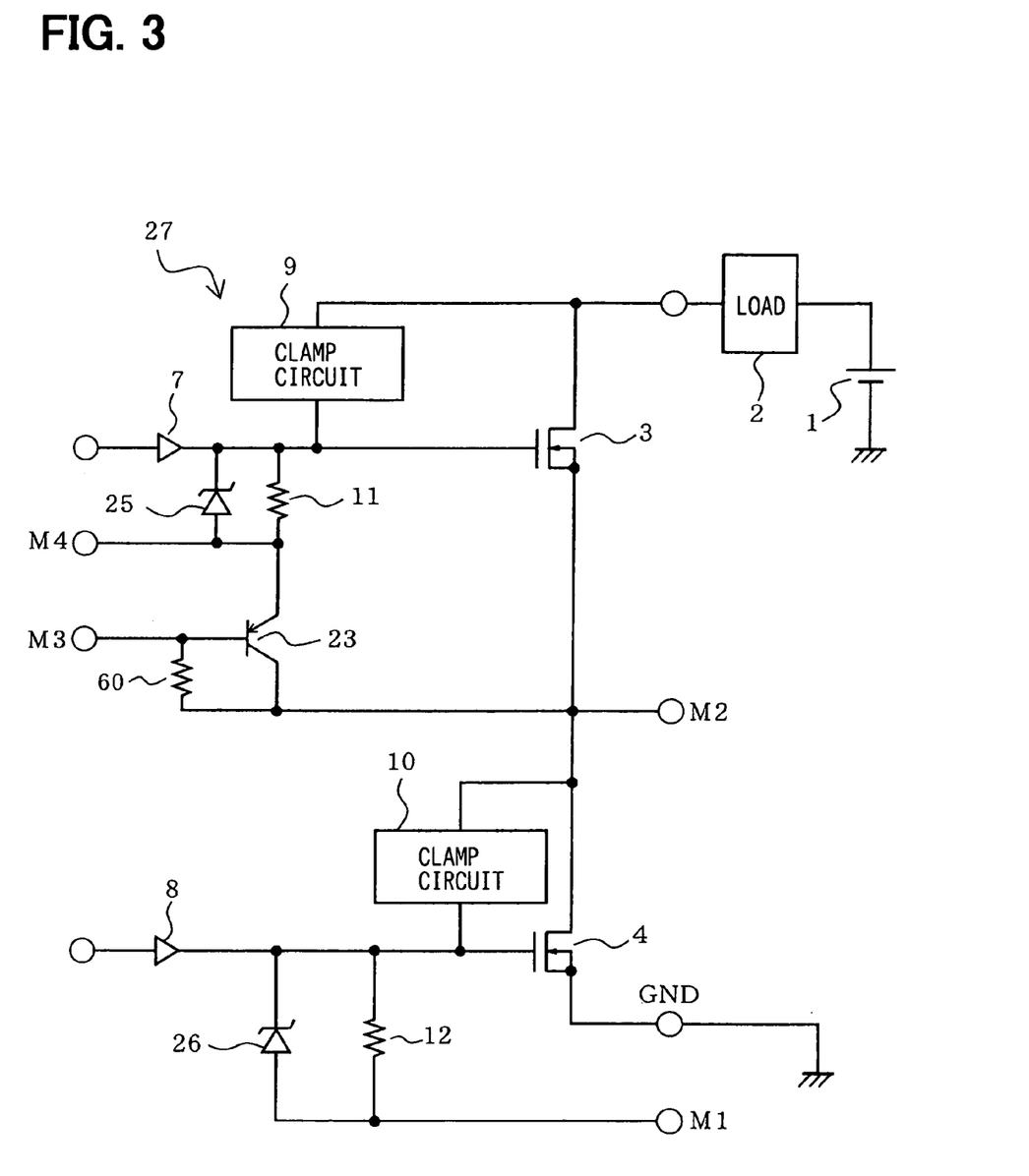
FIG. 3 is a circuit diagram illustrating a drive circuit according to the third embodiment of the invention.

A drive circuit 27 according to the third embodiment of the invention will be described with reference to FIG. 3.

The drive circuit 27 has the same structure as the second embodiment except for zener diodes 25, 26, which are respectively connected in parallel with the resistors 11, 12. The zener diodes 25, 26 protect the MOSFETS 3, 4 from excessively high voltage.

Figure 4:
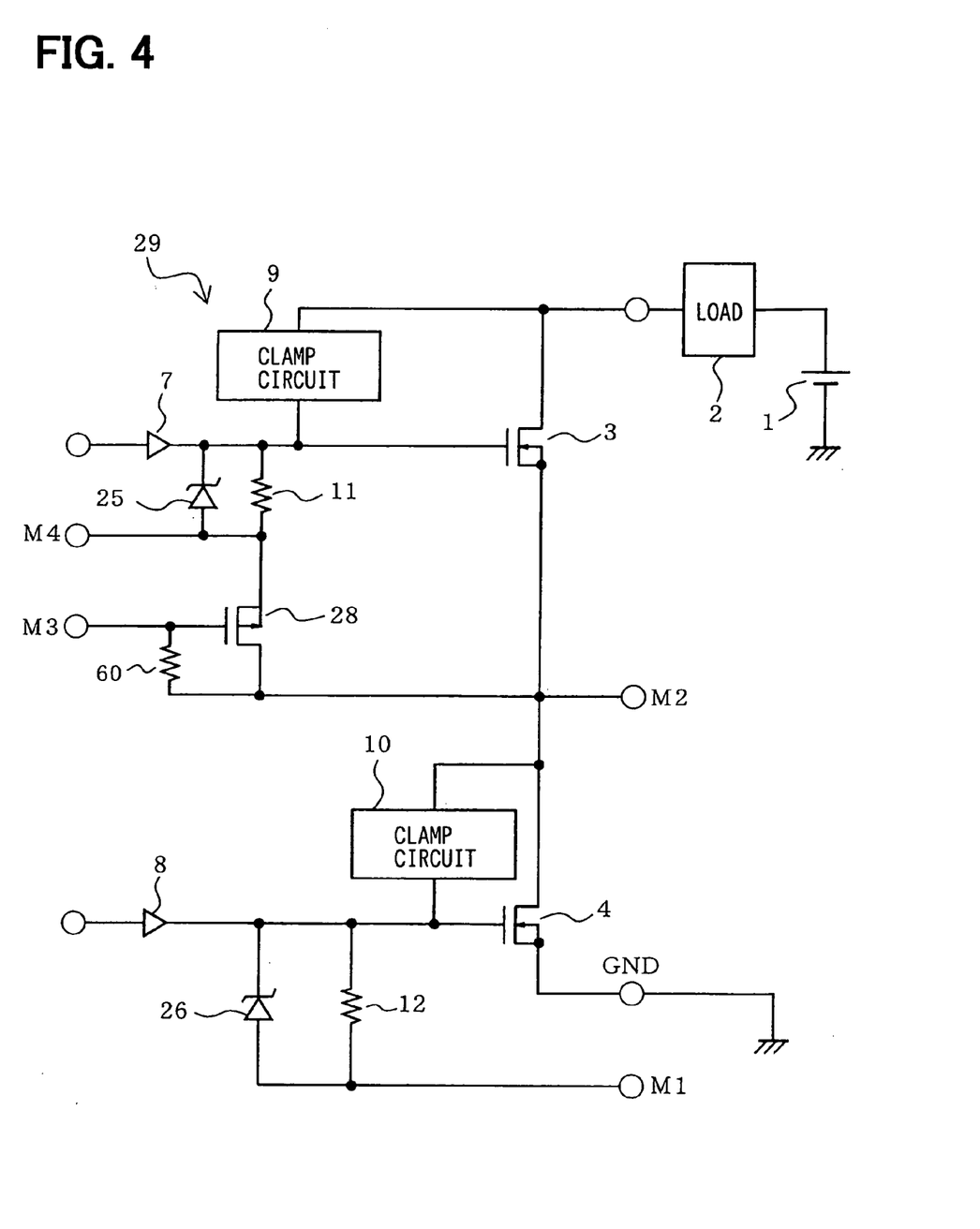
FIG. 4 is a circuit diagram illustrating a drive circuit according to the fourth embodiment of the invention.

A drive circuit 29 according to the fourth embodiment of the invention will be described with reference to FIG. 4.

The drive circuit 27 has a P-channel MOSFET 28 instead of the transistor 23. The operation is substantially the same as the third embodiment.

Figure 5:
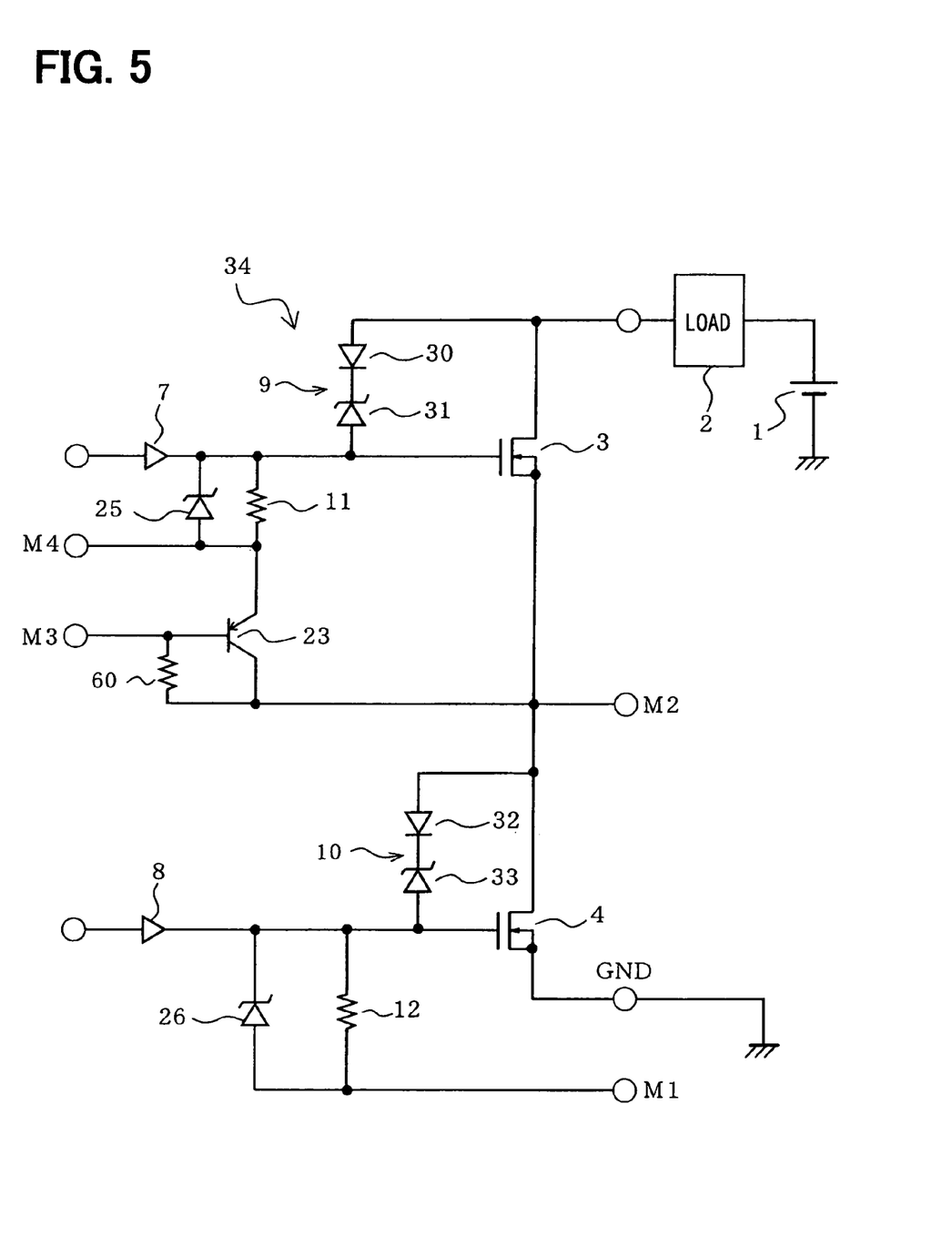
FIG. 5 is a circuit diagram illustrating a drive circuit according to the fifth embodiment of the invention.

A drive circuit 34 according to the fifth embodiment of the invention will be described with reference to FIG. 5.

The drive circuit 27 has the same structure as the second embodiment except for the clamp circuits 9, 10. The first clamp circuit 9 is composed of a backflow preventing diode 30 connected to the drain of the first MOSFET 3 in the direction to block current flowing from the gate to the drain thereof and a zener diode 31 connected in the other direction. The second clamp circuits 10 is composed of a backflow preventing diode 32 connected to the drain of the second MOSFET 4 in the direction to block current flowing from the gate to the drain thereof and a zener diode 33 connected in the other direction.

Figure 6:
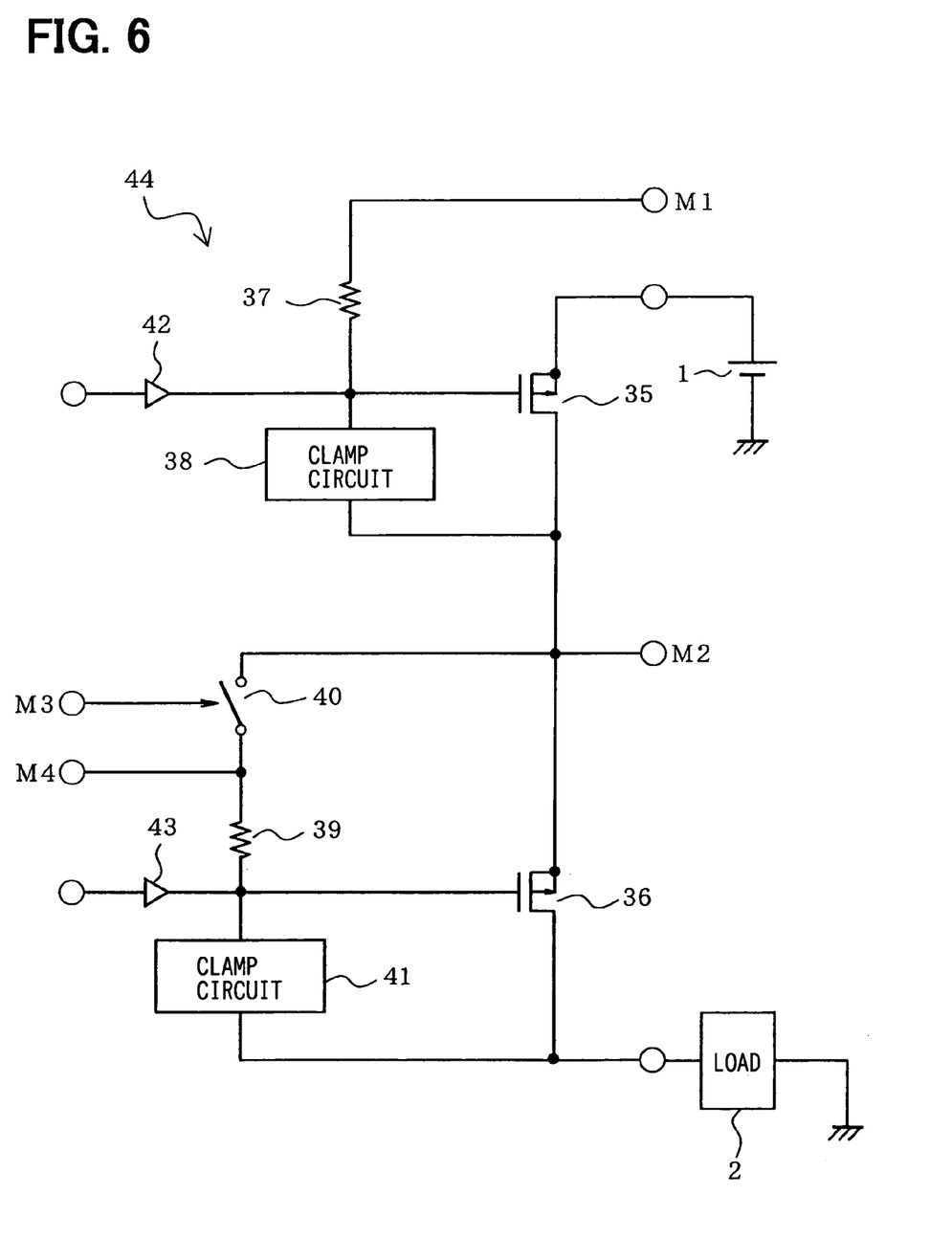
FIG. 6 is a circuit diagram illustrating a drive circuit according to the sixth embodiment of the invention.

A drive circuit 44 according to the sixth embodiment of the invention will be described with reference to FIG. 6.

The drive circuit 44 includes a pair of series-connected P-channel MOSFETS 35, 36 between the battery 1 and the electric load 2, the other side terminal of which is connected to the ground, drivers 42, 43, a pair of clamp circuits 38, 41, resistors 37, 39, a switch 40, test terminals M1, M2, M3, M4, etc. The gates of the MOSFETS 35, 36 are respectively connected to the drivers 42, 43 so that the same logical gate signal is applied to turn on or off current supplied to the electric load 2 from the battery 1. The source of the MOSFET 35 is connected to the positive terminal of the battery 1, and the drain of the MOSFET 36 is connected to the high-side terminal of the electric load 2. The other terminal (low-side terminal) of the electric load 1 is connected to the ground.

The clamp circuit 38 is connected between the gate and drain of the MOSFETS 35, and the clamp circuit 41 is connected between the gate and the drain of the MOSFETS 36. The resistor 37 is connected between the gate of the MOSFET 35 and the test terminal M1. The resistor 39 is connected between the gate of the MOSFETS 36 and the switch 40. The switch 40 is connected between the test terminal M2, which is connected to a joint of the series-connected MOSFETS 35, 36, and the test terminal M4. The test terminal M2 is connected to a joint of the first and second MOSFETS 3, 4, and the test terminal M3 is a terminal to operate the switch 22. The test terminal M4 is connected to a joint of the first resistor 39 and the switch 40 and to the test terminal M2 via the switch 40.

In operation, a low level gate signal, which is lower than the source voltage, is applied to the gates of the MOSFET 35 and the MOSFET 36 to turn them on.

If a big negative surge voltage is applied to the drain of the MOSFET 36, the MOSFETS 35, 36 do not turn on because the clamp circuits 38, 41 are connected in series via the resistor 39 and the switch 40 between the gate of the MOSFET 35 and the drain of the MOSFET 36. That is, the MOSFET 35 does not turn on because the gate signal thereof is much higher than a voltage level that is twice as low as the voltage level to start clamping of the clamp circuits 38, 41.

In the case of a screening or burning test, the switch 40 is opened. Then, a high voltage is applied to the test terminals M1 and M4 while the drain of the MOSFET 35, the test terminal M2 and the source of the MOSFET 36 are grounded. Therefore, it is possible to apply a high voltage to the oxidized film of the gates of the MOSFETS 35, 36.

Thus, the MOSFETS 35, 36 do not simultaneously turn on even when an excessive voltage is applied to MOSFETS 35, 36.

Figure 7:
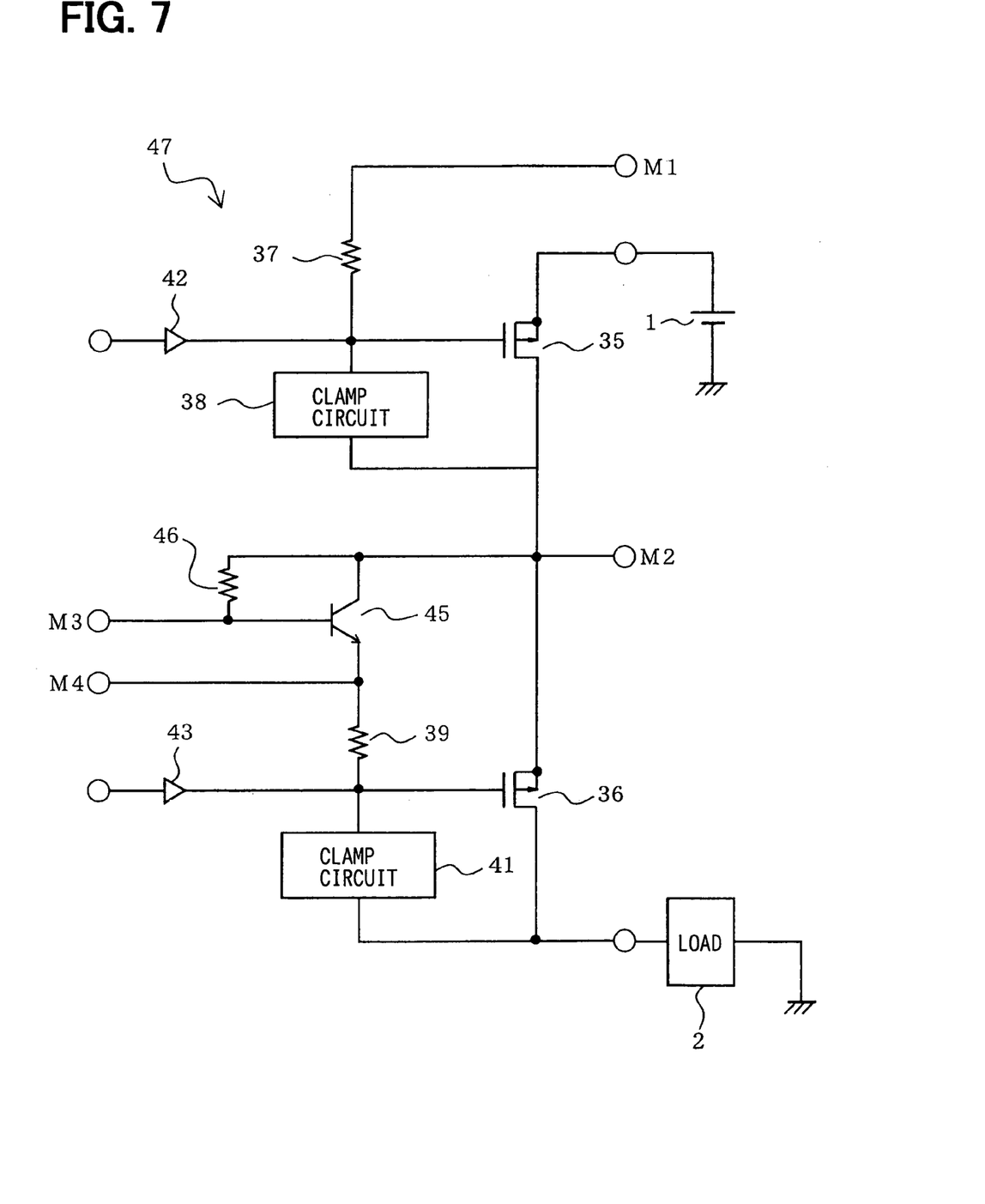
FIG. 7 is a circuit diagram illustrating a drive circuit according to the seventh embodiment of the invention.

A drive circuit 47 according to the seventh embodiment of the invention will be described with reference to FIG. 7.

The drive circuit 24 has a switch circuit that includes an NPN transistor 45 and a resistor 46 instead of the switch 40 of the sixth embodiment. The test terminal M3 is connected to the base of the transistor 45, and the resistor 46 is connected between the base and the collector of the transistor 45.

The transistor 45 is turned off by applying a low level signal on the test terminal M3 when a high voltage test is made, and turned on when the drive circuit 24 is operated without a signal on the test terminal M3 to drive the electric load 2.

Figure 8:
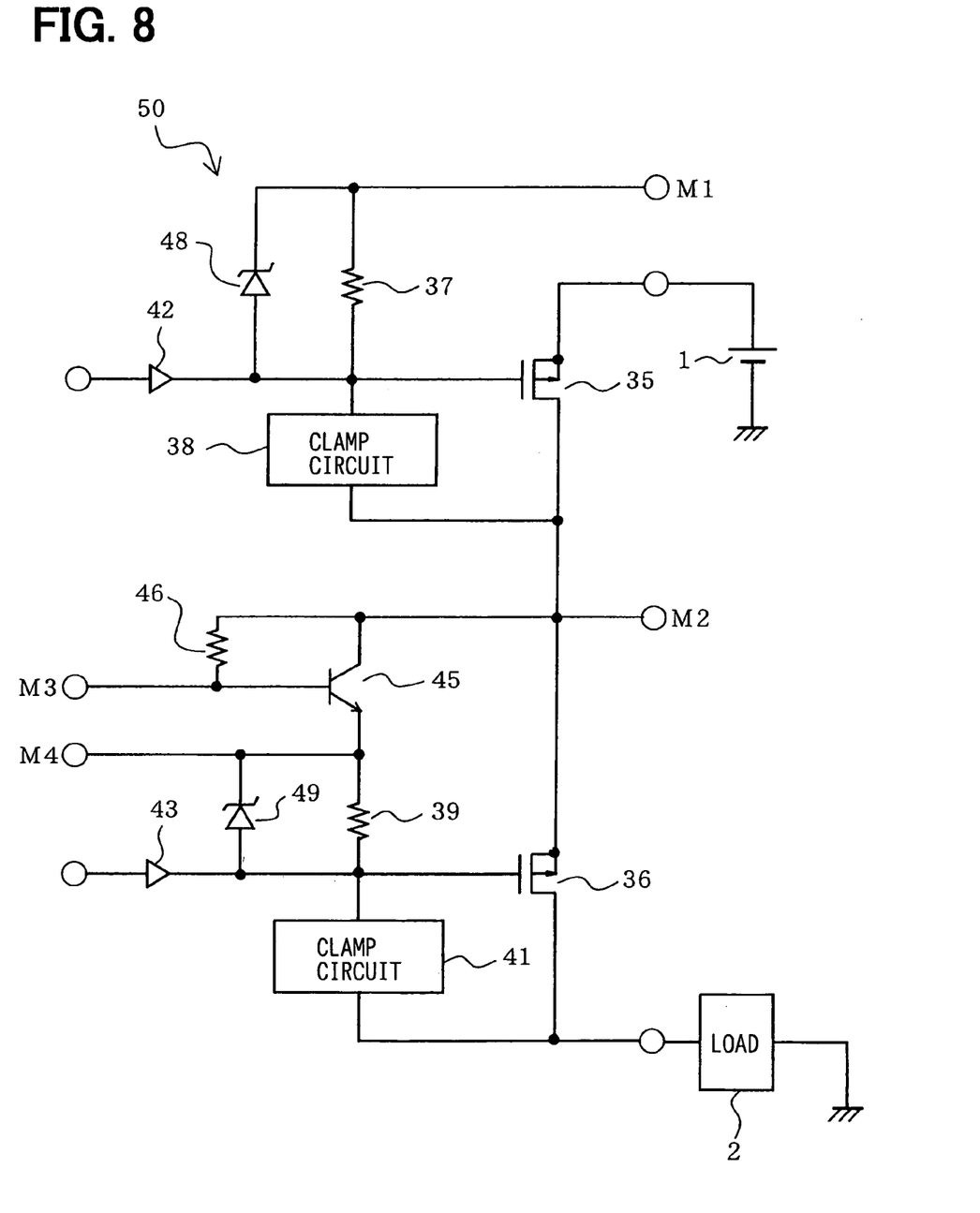
FIG. 8 is a circuit diagram illustrating a drive circuit according to the eighth embodiment of the invention.

A drive circuit 50 according to the eighth embodiment of the invention will be described with reference to FIG. 8.

The drive circuit 50 has the same structure as the seventh embodiment except for zener diodes 48, 49, which are respectively connected in parallel with the resistors 37, 38. The zener diodes 37, 38 protects the MOSFETS 3, 4 from excessively high voltage.

Figure 9:
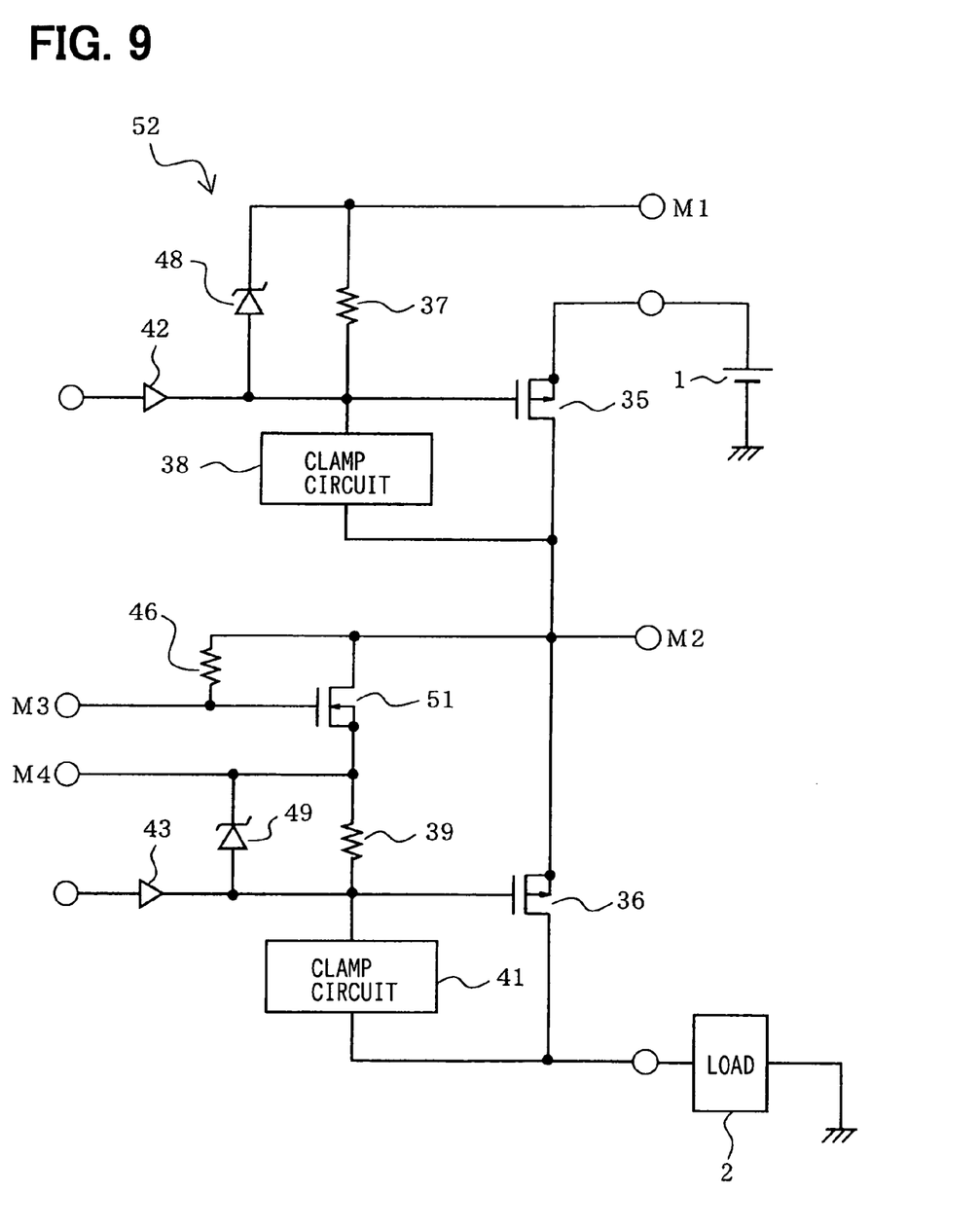
FIG. 9 is a circuit diagram illustrating a drive circuit according to the ninth embodiment of the invention.

A drive circuit 52 according to the ninth embodiment of the invention will be described with reference to FIG. 9.

The drive circuit 52 has an N-channel MOSFET 28 instead of the transistor 45 of the eighth embodiment. The operation is substantially the same as the eighth embodiment.

Figure 10:
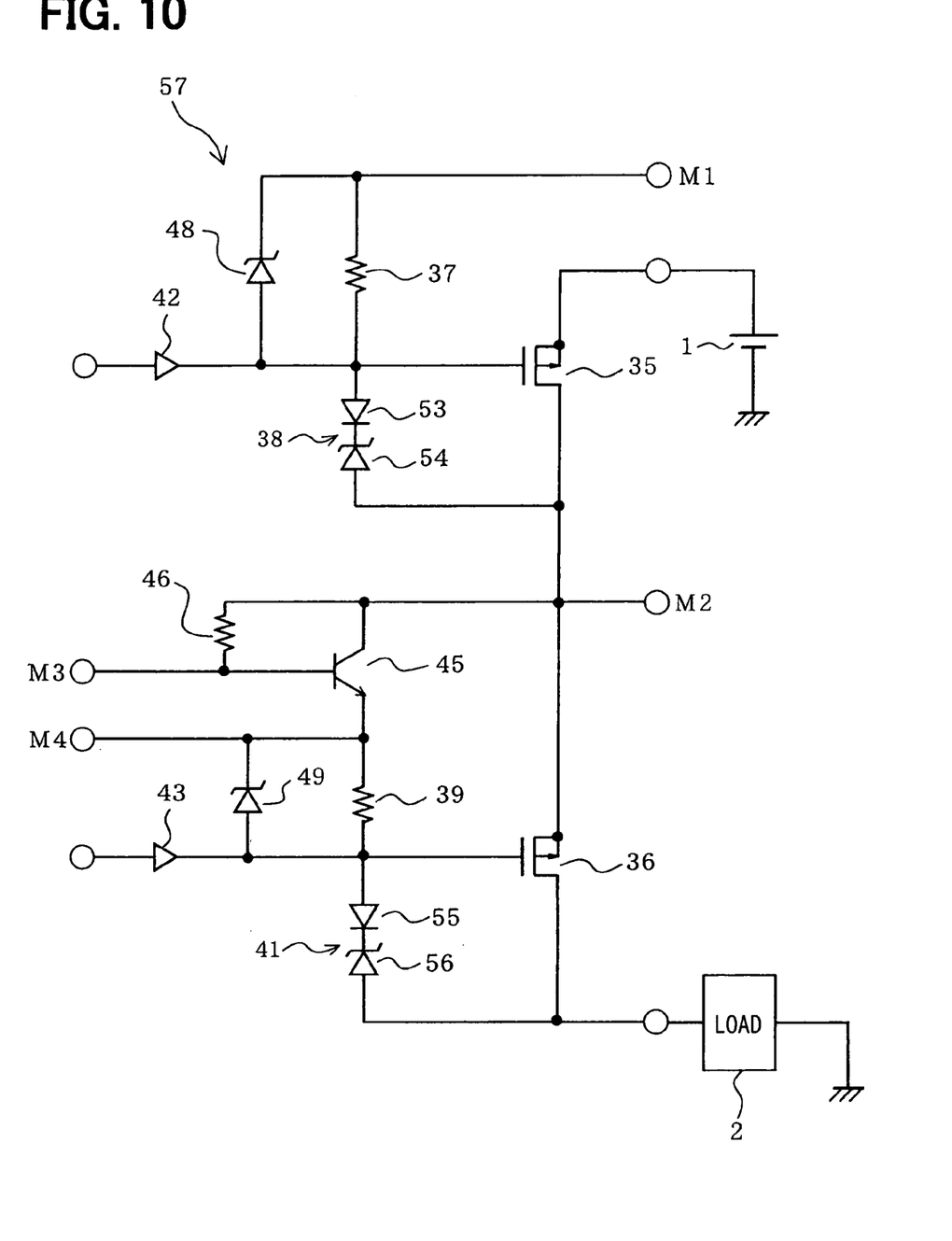
FIG. 10 is a circuit diagram illustrating a drive circuit according to the tenth embodiment of the invention.

A drive circuit 57 according to the tenth embodiment of the invention will be described with reference to FIG. 10.

The drive circuit 57 has the same structure as the eighth embodiment except for the clamp circuits 38, 41. The clamp circuits 38, 41 is composed of a backflow preventing diode 53 connected to the gate of the MOSFET 35 in the direction to block current flowing from the drain to the gate thereof and a zener diode 54 connected in the other direction. The clamp circuits 41 is composed of a backflow preventing diode 55 connected to the gate of the MOSFET 36 in the direction to block current flowing from the drain to the gate thereof and a zener diode 56 connected in the other direction.

Instead of the resistors 46, 60, means for turning on or off the switch circuit may be used for the drive circuits described above.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. A drive circuit for supplying electric power to an electric load from a DC electric source via a power line, said drive circuit comprising:
    a pair of series-connected first and second MOSFETS of the same conduction type, said first MOSFET having a drain connected to the electric load and said second MOSFET having a source connected to the DC electric source;
    a pair of clamp circuits respectively connected between drains and gates of the first and second MOSFETS;
    a series circuit of a first resistor and a switch, said series circuit being connected between the gate and the source of said first MOSFET;
    a first test terminal;
    a second test terminal connected to a joint of said first and second MOSFETS;
    a third test terminal for operating said switch;
    a fourth test terminal connected to a joint of said first resistor and said switch; and
    a second resistor connected between the gate of the second MOSFET and the first test terminal.

2. The drive circuit as claimed in claim 1, wherein said first and second MOSFETS are N-channel MOSFETS.

3. The drive circuit as claimed in claim 1, wherein said switch comprises a semiconductor having a control terminal connected to said third test terminal and a resistor connected between the control terminal and the source of said first MOSFET.

4. The drive circuit as claimed in claim 2, wherein said switch comprises a PNP transistor having a base terminal connected to said third test terminal and a resistor connected between the base terminal and the source of said first MOSFET.

5. The drive circuit as claimed in claim 1, wherein said first and second MOSFETS are P-channel MOSFETS.

6. The drive circuit as claimed in claim 4, wherein said switch comprises a NPN transistor having a base terminal connected to said third test terminal and a resistor connected between the base terminal and the source of said first MOSFET.

7. A method of applying high voltage test on the drive circuit as claimed in claim 2, comprising:
    a step of opening said switch;
    a step of grounding the drain of said first MOSFET, said second test terminal and the source of said second MOSFET; and
    a step of applying test voltage to said first and fourth test terminals.

8. A method of applying high voltage test on the drive circuit as claimed in claim 5, comprising:
    a step of opening said switch;
    a step of grounding said first and fourth test terminals; and
    a step of applying test voltage to the drain of said first MOSFET, said second test terminal and the source of said second MOSFET.

* * * * *